(12) United States Patent
Park et al.

(10) Patent No.: US 11,395,377 B2
(45) Date of Patent: Jul. 19, 2022

(54) CERAMIC HEATER HAVING IMPROVED DURABILITY

(71) Applicant: MiCo Ceramics Ltd., Anseong (KR)

(72) Inventors: Myoung Ha Park, Pyeongtaek (KR); Chul Ho Jung, Anseong (KR)

(73) Assignee: MICo Ceramics Ltd., Anseong (KR)

( * ) Notice: Subject to any disclaimer, the term of this patent is extended or adjusted under 35 U.S.C. 154(b) by 247 days.

(21) Appl. No.: 16/603,796

(22) PCT Filed: Feb. 23, 2018

(86) PCT No.: PCT/KR2018/002245
§ 371 (c)(1),
(2) Date: Oct. 8, 2019

(87) PCT Pub. No.: WO2018/194254
PCT Pub. Date: Oct. 25, 2018

(65) Prior Publication Data
US 2021/0100072 A1    Apr. 1, 2021

(30) Foreign Application Priority Data
Apr. 19, 2017  (KR) .................. 10-2017-0050552

(51) Int. Cl.
*H05B 3/14* (2006.01)

(52) U.S. Cl.
CPC ....... *H05B 3/141* (2013.01); *H05B 2203/017* (2013.01)

(58) Field of Classification Search
CPC .... H05B 3/14; H05B 3/265; H05B 2203/017; H01L 21/324; H01L 21/48; H01L 21/67; H01L 21/67098; H01L 21/4807
See application file for complete search history.

(56) References Cited

U.S. PATENT DOCUMENTS

| | | | |
|---|---|---|---|
| 6,490,144 B1 * | 12/2002 | Narendrnath | H01L 21/67098 361/234 |
| 6,731,496 B2 * | 5/2004 | Hiramatsu | H05B 3/143 219/544 |
| 8,480,806 B2 * | 7/2013 | Nakamura | H01L 21/67103 118/728 |

(Continued)

FOREIGN PATENT DOCUMENTS

| | | |
|---|---|---|
| JP | 2005197393 A | 7/2005 |
| JP | 2008305968 A | 12/2008 |

(Continued)

OTHER PUBLICATIONS

International Search Report dated Jun. 14, 2018 for PCT Application No. PCT/KR2018/002245.

*Primary Examiner* — Shawntina T Fuqua

(57) ABSTRACT

Disclosed is a ceramic heater and a ceramic plate for a ceramic heater, wherein, in order to prevent crack development at a ceramic surface around an electrode part and thereby improve durability, the end of a support part for an electrode rod is spaced apart from the ceramic surface opposite thereto, and a space for placing a filler mass is provided around the end of the support part for the electrode rod, whereby force or stress applied to the ceramic surface due to the expansion of the support part or by the filler mass is removed.

16 Claims, 6 Drawing Sheets

(56) References Cited

U.S. PATENT DOCUMENTS

| | | | |
|---|---|---|---|
| 2008/0017627 A1* | 1/2008 | Iwata | H01L 21/67109 |
| | | | 219/260 |
| 2008/0116187 A1 | 5/2008 | Sugimoto | |
| 2009/0277895 A1 | 11/2009 | Komatsu | |
| 2013/0229746 A1* | 9/2013 | Aikawa | C04B 37/001 |
| | | | 361/234 |

FOREIGN PATENT DOCUMENTS

| | | | |
|---|---|---|---|
| JP | 2009188390 A | 8/2009 |
| JP | 5331490 B2 | 10/2013 |
| KR | 100796621 B1 | 1/2008 |
| KR | 1020080046797 A | 5/2008 |
| KR | 1020090046436 A | 5/2009 |
| KR | 1020130059764 A | 6/2013 |
| KR | 1020140142548 A | 12/2014 |
| TW | 200842973 A | 11/2008 |

\* cited by examiner

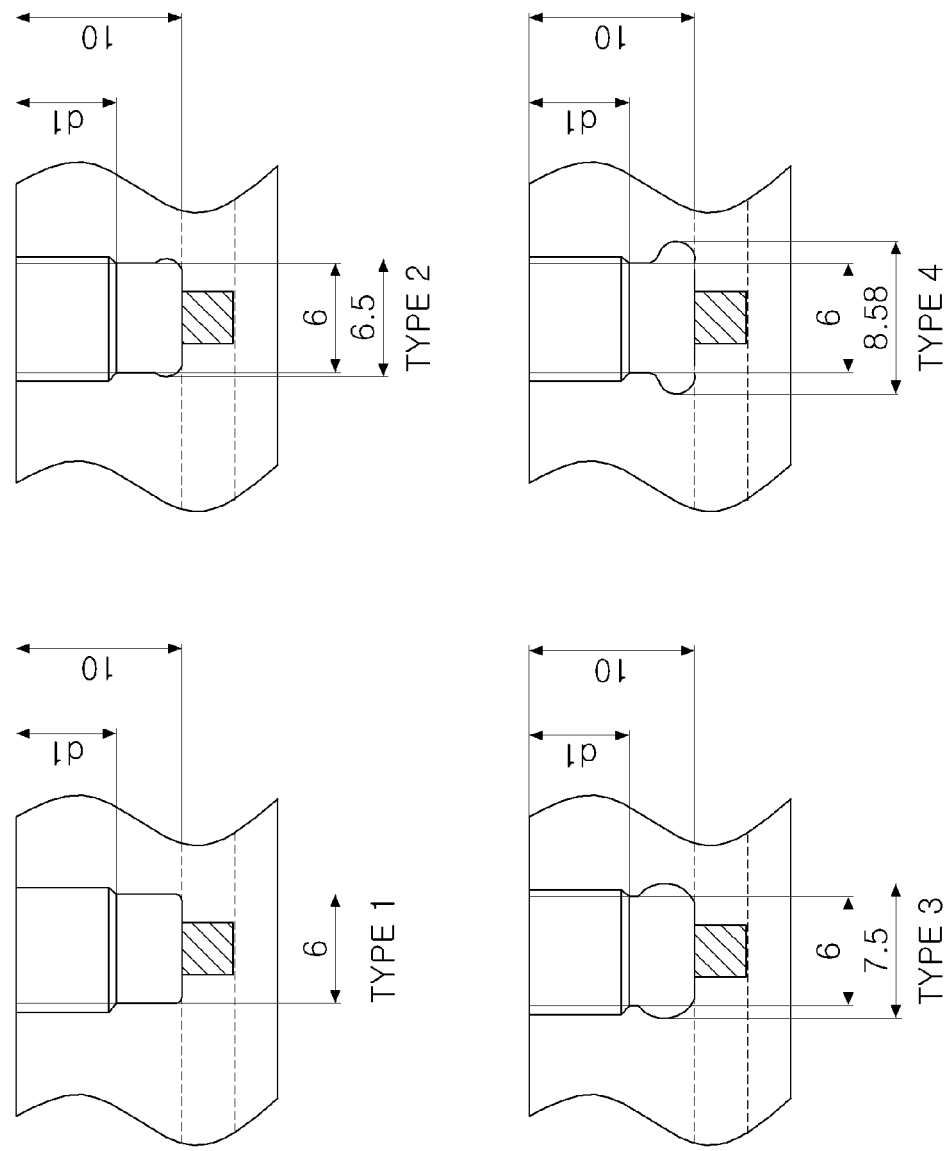

CERAMIC HEATER HAVING IMPROVED DURABILITY

This application is a National Phase Entry Application of PCT Application No. PCT/KR2018/002245 filed on 23 Feb. 2018, which claims priority to Korean Patent Application No. 10-2017-0050552 filed on 19 Apr. 2017 in Korean Intellectual Property Office, the entire contents of which is hereby incorporated by reference in its entirety.

BACKGROUND OF THE INVENTION

Field of the Invention

The present invention relates to a ceramic heater, and more particularly, to a ceramic heater and a ceramic plate for a ceramic heater which have an improved durability by preventing crack development caused by force or stress applied to a ceramic surface in an electrode part.

BACKGROUND OF THE INVENTION

A ceramic heater is used to heat-treat, at a predetermined heating temperature, a heat treatment subject such as a semiconductor wafer, a glass substrate, a flexible substrate, and the like for various purposes. The ceramic heater is sometimes combined with a function of an electrostatic chuck to treat the semiconductor wafer.

FIG. 1 is a view for explaining a ceramic heater in the related art. Referring to FIG. 1, the ceramic heater in the related art has an electrode part provided at a central portion of a ceramic plate 10 and configured to be coupled to an external electrode rod 30. A heating element 11 is embedded in the form of a ring or the like in the ceramic plate 10, and a connector 12 is embedded to be electrically connected to the predetermined heating element 11 around the electrode part at the central portion of the ceramic plate 10. In the electrode part, a support body 20 coupled to the electrode rod 30 is thread-coupled through a thread formed on an opening portion, and an end of the electrode rod 30 is brazed and electrically connected to the connector 12.

In the ceramic heater in the related art, the thread of the electrode part is formed to a bottom surface of the opening portion, and as the support body 20 is coupled through the thread, an end of the support body 20 is in contact with or adjacent to a ceramic surface of the opening portion.

Therefore, as the heater is used for a long period of time or during the brazing, the support body 20 is expanded and deformed and thus force or stress is applied to the ceramic surface, which causes a problem in that cracks are formed in a surrounding ceramic portion, as illustrated in FIG. 1.

In addition, a filler mass, which is produced when a conductive filler is melted and solidified at the time of brazing the end of the electrode rod 30 and the connector 12, needs to be placed in a surrounding space, but because there is no space or a narrow space around the end of the support body 20, the filler mass applies force or stress to the surrounding ceramic surface, which causes a problem in that cracks are formed in the surrounding ceramic portion, as illustrated in FIG. 1.

As a related document, Korean Patent Application Laid-Open No. 10-2008-0046797 (May 28, 2008) may be referenced.

BRIEF SUMMARY OF THE INVENTION

An object of the present invention is to solve the foregoing problems and other problems. Another object is to provide a ceramic heater and a ceramic plate for a ceramic heater, in which to prevent crack development at a ceramic surface around an opening portion of an electrode part and thus to improve durability, an end of a support part of an electrode rod is spaced apart from the ceramic surface opposite thereto, and a space for placing a filler mass is provided around the end of the support part of the electrode rod, whereby force or stress applied to the ceramic surface due to the expansion of the support part or by the filler mass is removed.

An exemplary embodiment of the present invention provides a ceramic heater comprising: a ceramic plate including an embedded heating element, a thread formed on a part of an inner circumferential surface of an opening portion, and a connector electrically connected to the heating element and embedded to be partially exposed from a bottom surface of the opening portion; and a support eyelet fastened through the thread and coupled to an electrode rod, in which a concave portion is formed to be recessed inward in an inner circumferential surface of the opening portion at an end adjacent to the bottom surface. The support eyelet is fastened through the thread so that an end of the support eyelet is spaced apart from the bottom surface of the opening portion at a predetermined distance.

Another exemplary embodiment of the present invention provides a ceramic plate including: a thread formed on a part of an inner circumferential surface of an opening portion and configured to fasten a support eyelet coupled to an electrode rod; a connector electrically connected to an embedded heating element and embedded to be partially exposed through from a bottom surface of the opening portion; and a concave portion recessed inward at an end adjacent to the bottom surface.

The concave portion is configured to accommodate a filler mass produced at the time of brazing an end surface of the electrode rod and the connector after the support eyelet is fastened. Therefore, stress applied to a surrounding ceramic surface by the filler mass may be removed.

The support eyelet may be fastened through the thread so that an end of the support eyelet is spaced apart from the bottom surface of the opening portion at a predetermined distance. Therefore, stress applied to a surrounding ceramic surface by the end of the support eyelet due to thermal expansion or deformation may be removed.

A depth from an inlet of the opening portion to an end of a portion having the thread may be 10% to 90% of an overall depth of the opening portion.

An end of the support eyelet fastened through the thread may be spaced apart from the bottom surface of the opening portion by 1 mm to 5 mm.

The concave portion may be roundly formed such that a maximally recessed portion is recessed inward by 0.1 mm to 3 mm from an extension line of the inner circumferential surface before the concave portion is formed.

BRIEF DESCRIPTION OF THE DRAWINGS

The above and other objects, features and other advantages of the present invention will be more clearly understood from the following detailed description taken in conjunction with the accompanying drawings, in which:

FIG. 5 is a view illustrating four types of concave portions for explaining an experimental result related to a degree to which a concave portion is formed in the ceramic heater according to the exemplary embodiment of the present invention.

DETAILED DESCRIPTION OF THE INVENTION

Figure 1:
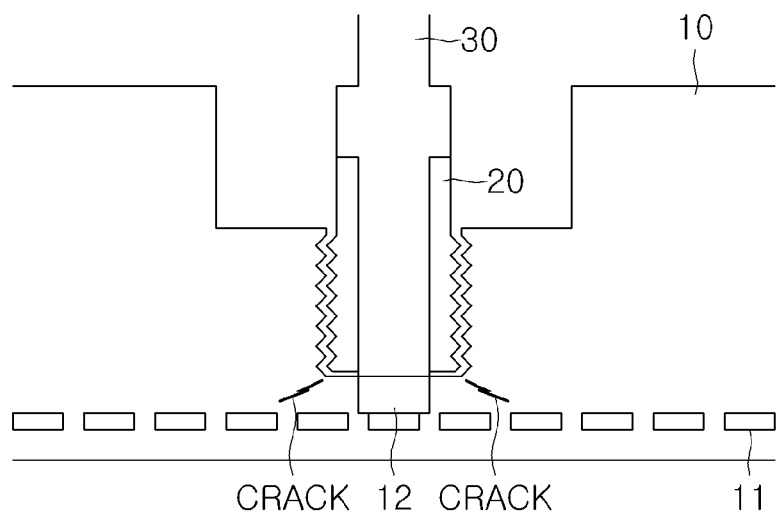
FIG. 1 is a view for explaining a ceramic heater in the related art.

Hereinafter, the present invention will be described in detail with reference to the accompanying drawings. In this case, the same constituent elements will be designated by the same reference numerals in the respective drawings. Further, a detailed description of a function and/or a configuration already publicly known will be omitted. The following disclosed contents will be described focusing on parts necessary for understanding operations of various exemplary embodiments, and the descriptions of constituent elements will be omitted if the descriptions may obscure the subject matter of the present invention. Further, some constituent elements may be exaggerated, omitted, or schematically illustrated in the drawings. A size of each constituent element does not entirely reflect an actual size. Therefore, the contents disclosed herein are not limited by relative sizes of or intervals between constituent elements illustrated in the drawings.

Figure 2A:
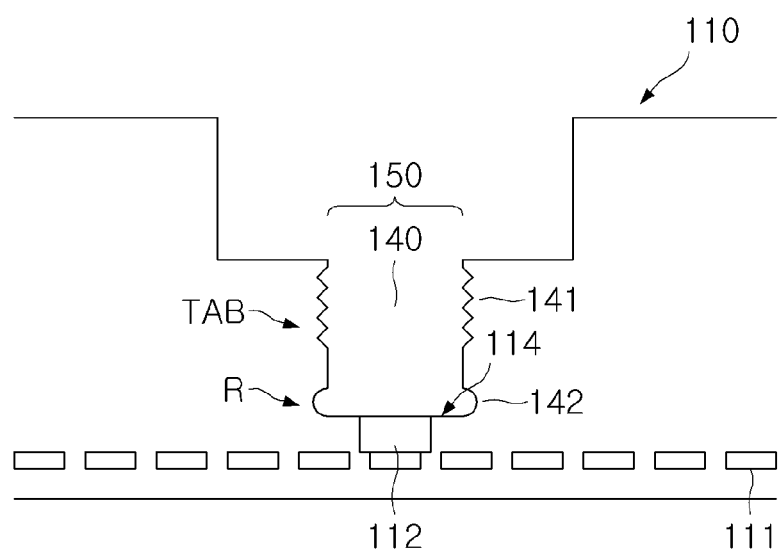
FIGS. 2A and 2B are views for explaining a ceramic heater according to an exemplary embodiment of the present invention.
Figure 2B:
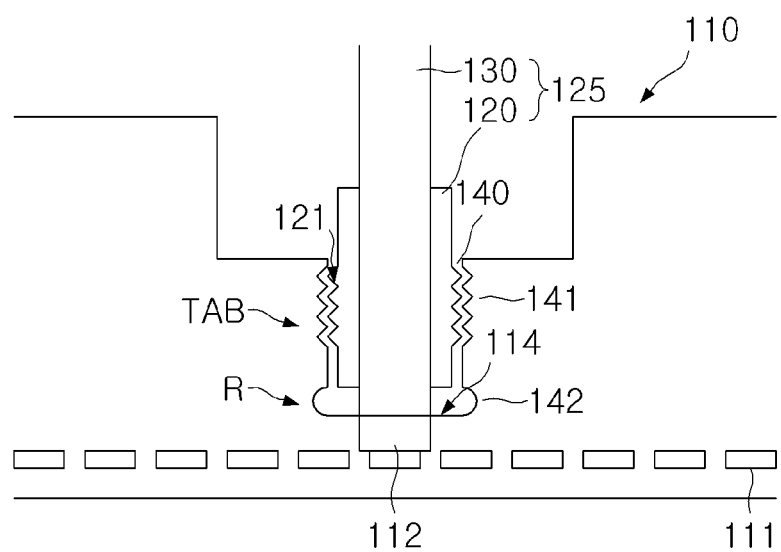

FIGS. 2A and 2B are views for explaining a ceramic heater according to an exemplary embodiment of the present invention. FIG. 2A is a view schematically illustrating an electrode part 150 of the ceramic heater according to the exemplary embodiment of the present invention, and FIG. 2B is a view additionally illustrating an electrode 125 fastened to an opening portion 140 of the electrode part 150 illustrated in FIG. 2A.

Referring to FIGS. 2A and 2B, the ceramic heater according to the exemplary embodiment of the present invention includes a ceramic plate 110 including a heating element 111 and the electrode part 150, and the electrode 125 fastened to the opening portion 140 of the electrode part 150, that is, the ceramic heater includes an electrode rod 130, and a support eyelet 120 coupled to the electrode rod 130. The ceramic plate 110 includes the heating element 111 embedded in a ceramic sintered body. The electrode 125 is a constituent element for supplying electric power (e.g., radio frequency (RF) electric power) to the heating element 111, and the electrode 125 includes the electrode rod 130, and the support eyelet 120 coupled to the electrode rod 130.

The electrode part 150 of the ceramic plate 110 includes a connector 112 and a concave portion 142 provided in the opening portion 140 to connect the electrode 125, and the electrode part 150 includes a thread 141 formed on a part of an inner circumferential surface of the opening portion 140. The support eyelet 120 coupled to the electrode rod 130 has a thread 121 (e.g., an external thread) formed on an outer circumferential surface thereof so that the support eyelet 120 is fastened through the thread 141 (e.g., an internal thread).

Here, the ceramic may include various materials such as $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, BxCy, BN, $SiO_2$, SiC, YAG, Mullite, and $AlF_3$.

To supply radio frequency (RF) electric power to the heating element 111, each of the connector 112, the electrode rod 130, and the support eyelet 120 may be made of a conductive material, for example, tungsten (W), molybdenum (Mo), silver (Ag), nickel (Ni), gold (Au), niobium (Nb), titanium (Ti), or an alloy thereof. The heating element 111 may also be made of the above-mentioned conductive material.

The electrode rod 130 is coupled to the support eyelet 120. The electrode rod 130 may be coupled to the support eyelet 120 so that the electrode rod 130 extends by a predetermined length further from an end of the support eyelet 120, such that an end portion of the electrode rod 130 is brazed to the connector 112. The electrode rod 130 may be coupled and electrically connected to the support eyelet 120 through various methods. For example, the electrode rod 130 may be coupled to the support eyelet 120 by using a bonding agent including an electrically conductive material at an interface between the electrode rod 130 and the support eyelet 120. For example, a mixture of organic epoxy and metal such as silver (Ag), platinum (Pt), gold (Au), nickel (Ni), or copper (Cu) may be used as the bonding agent.

The connector 112 is embedded in the ceramic plate 110 so that the connector 112 is electrically connected to the heating element 111 and partially exposed from a bottom surface of the opening portion 140. An end surface of the electrode rod 130 is electrically connected to the connector 112 by brazing. For the purpose of the brazing, it is possible to perform a method of applying in advance a conductive filler onto the bottom surface of the opening portion 140 or the exposed portion of the connector 112, bringing the end surface of the electrode rod 130 into close contact with the connector 112, and then heating, at a high temperature, and cooling the conductive filler.

In addition to the thread 141 (e.g., an internal thread) configured to be coupled to the thread 121 (e.g., an external thread) of the support eyelet 120 coupled to the electrode rod 130, and in addition to the connector 112 embedded in the ceramic plate 110 so as to be partially exposed through the bottom surface of the opening portion 140, the electrode part 150 of the ceramic plate 110 includes, in the opening portion 140, a concave portion 142 roundly (R) formed to be recessed inward in an inner circumferential surface of the opening portion 140 at the end of the opening portion 140 adjacent to a bottom surface 114.

The RF electric power is supplied to the heating element 111 through the connector 112 joined to the electrode rod 130, such that a heat treatment subject may be heated by heat generated from the heating element 111 and heat-treated at a predetermined heating temperature. However, the ceramic plate 110 illustrated in FIG. 2B may be reversed, and a heat treatment subject such as a semiconductor wafer, a glass substrate, a flexible substrate, or the like for various purposes may be heated and heat-treated on an upper surface of the ceramic plate 110. In some instances, a heat treatment subject for various purposes may be heated and heat-treated on a lower surface of the ceramic plate 110 illustrated in FIG. 2B. The ceramic heater according to the present invention may be combined with a function of an electrostatic chuck.

Figure 3:
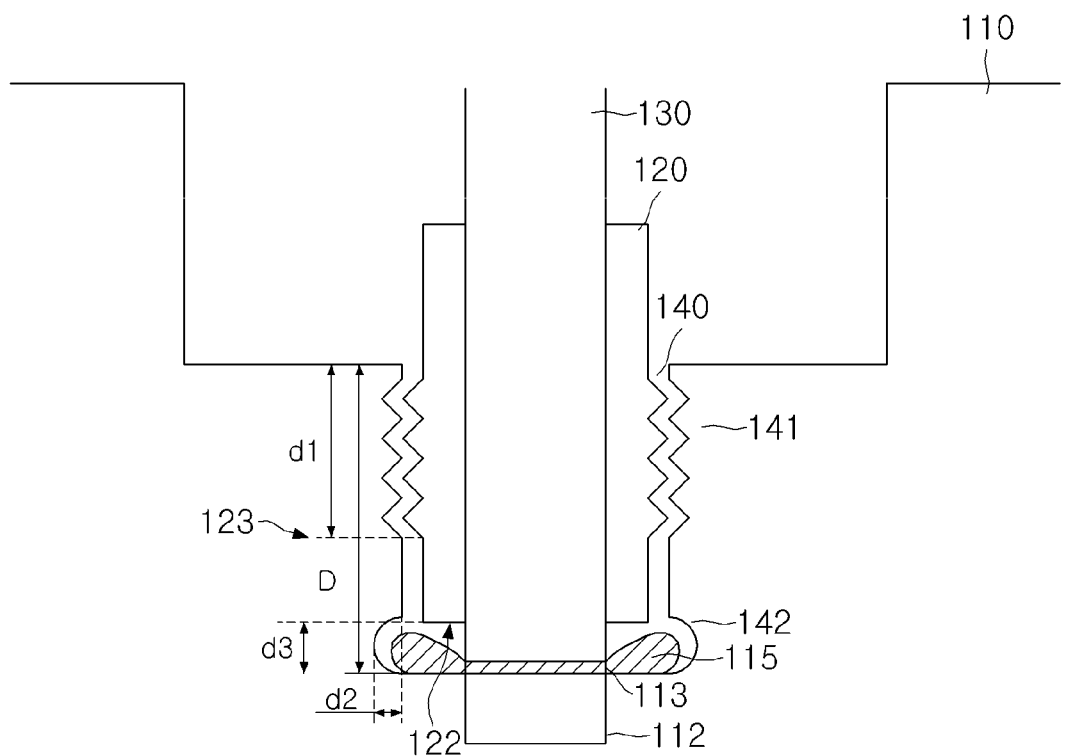
FIG. 3 is an enlarged view of a portion around an electrode part of the ceramic heater illustrated in FIG. 2B.

FIG. 3 is an enlarged view of a part around the electrode part 150 of the ceramic heater illustrated in FIG. 2B.

Referring to FIG. 3, the concave portion 142 accommodates (or receives) a residual filler mass 115 produced at the time of brazing, by using the filler 113, the end surface of the electrode rod 130 and the exposed portion of the connector after the support eyelet 120 is fastened. To ensure a space for receiving the residual filler mass 115, the concave portion 142 may be roundly formed such that a maximally recessed portion, which is indicated by d2 in FIG. 3, is recessed inward, by 0.1 mm to 3 mm, from an extension line of the inner circumferential surface of the opening portion 140 before the concave portion 142 is formed. It may be difficult to form the concave portion 142 or the effect of preventing the crack development may deteriorate if a range in which the concave portion 142 is formed is out of the above-mentioned processing range.

The following Table 1 shows an experimental result related to various types of concave portions 142 (see FIG. 5). That is, for example, Table 1 shows a case in which the concave portion 142 is not formed (Type 1), a case in which the concave portion 142 is roundly formed from the extension line of the inner circumferential surface of the opening portion 140 and a diameter of the maximally recessed portion of the concave portion 142 is 6.5 mm (Type 2), and a case in which the diameter of the maximally recessed portion of the concave portion 142 is 7.5 mm (Type 3) when an overall depth D of the opening portion 140 is 10 mm and a diameter of the inner circumferential surface of the opening portion 140 is 6 mm.

TABLE 1

| Type | Presence or absence of crack | Joined state | Remarks |
| --- | --- | --- | --- |
| 1 | Poor | Poor | Occurrence of crack |
| 2 | Good | Excellent | — |
| 3 | Good | Good | — |

As shown in Table 1, in the case of Type 1, because there is no space for receiving the residual filler mass 115, a crack is formed, and a brazing defect occurs. In the case of Type 2 and Type 3, since the appropriate concave portion 142 is formed, a good state is implemented without crack development and brazing is also excellent or good.

An experiment could not be performed on a case in which the diameter of the maximally recessed portion of the concave portion 142 was 8.58 mm (Type 4), as illustrated in FIG. 5, because it was difficult to form the concave portion 142 when the diameter of the concave portion 142 was large. However, in the case of Type 4, a good state will be ensured without crack development and the brazing will also be good within an appropriate range in respect to the diameter of the concave portion 142 which is larger than that in Type 3 and made by an appropriate cutting method. Therefore, the concave portion 142 may be roundly formed such that the maximally recessed portion, which is indicated by d2 in FIG. 3, is recessed inward, by 0.1 mm to 3 mm, from the extension line of the inner circumferential surface of the opening portion 140 before the concave portion 142 is formed. However, the present invention is not limited thereto, and in some instances, the diameter d2 of the concave portion 142 may be larger than the above-mentioned diameter.

In the related art, because there is no space or a narrow space around an end of an eyelet, a surrounding space for placing a filler mass, which is produced when a conductive filler is melted and solidified at the time of brazing, is not sufficient, and as a result, the filler mass applies stress to the surrounding ceramic surface, which causes a crack.

As described above, in the present invention, the space for placing the filler mass 115 is provided around the end of the support eyelet 120, and thus stress (or force) applied to the ceramic surface 114 around the bottom by the filler mass 115 is removed, such that it is possible to improve durability by preventing crack development at the ceramic surface around the opening portion 140 of the electrode part which occurred in the related art (see FIG. 1).

In addition, in a case in which like the related art, the thread on the inner circumferential surface of the opening portion and the thread on the outer circumferential surface of the eyelet, particularly, the thread on the inner circumferential surface of the opening portion are formed to the bottom surface, the end of the eyelet is in contact with or adjacent to the ceramic surface at the bottom, and as a result, as the heater is used for a long period of time or during the brazing, the eyelet is expanded and deformed, stress is applied to the ceramic surface, and cracks are formed in a surrounding ceramic portion.

In the present invention, as illustrated in FIG. 3, the fastening of the support eyelet 120 may be restricted by the thread 141 formed by tapping so that the end of the support eyelet 120 is spaced apart from the bottom surface 114 of the opening portion 140 at a predetermined distance d3. For example, a depth d1 from an inlet of the opening portion 140 to an end of the portion having the thread 141 may be 10% to 90% of an overall depth D of the opening portion 140, and an end 122 of the support eyelet 120 may be spaced apart from an end 123 of the portion having the thread 141 by a predetermined length, such that the end 122 of the support eyelet 120 may be stably spaced apart from the bottom surface 114 of the opening portion 140 at the predetermined distance d3. For example, the spacing distance d3 from the bottom surface 114 of the opening portion 140 to the end 122 of the support eyelet 120 fastened through the thread 141 may be 1 mm to 5 mm.

The end 122 of the support eyelet 120 may be fastened to be lowered to the end 123 of the portion having the thread 141. In this case, Table 2 shows an experimental result in respect to cases in which the thread tapping depth d1, that is, the depth d1 from the inlet of the opening portion 140 to the end of the portion having the thread 141 is 1, 3, 6, 8, and 10 mm when the overall depth D of the opening portion 140 is 10 mm.

TABLE 2

| No. | Tapping depth (d1) (Electrode of 10 mm) | Presence or absence of crack | Joined state | Remarks |
| --- | --- | --- | --- | --- |
| 1 | 1 mm | Good | Poor | Impossible to fasten eyelet |
| 2 | 3 mm | Good | Poor | Brazing defect |
| 3 | 6 mm | Good | Excellent | — |
| 4 | 8 mm | Good | Excellent | — |
| 5 | 10 mm | Poor | Poor | Crack development and joining defect |

As shown in Table 2, in the case in which the thread tapping depth d1 is 1 mm, a good state is implemented without crack development, but the support eyelet 120 cannot be fastened because the number of threads 121/141 is small. In the case in which the depth d1 is 3 mm, a good state is implemented without crack development, but a degree of thread-coupling is low, and a brazing defect occurs. In addition, in the case in which the depth d1 is 10 mm and equal to the overall depth D of the opening portion 140, the crack development and the brazing defect occur. However, in the case in which the depth d1 is 6 mm or 8 mm, a good state is implemented in respect to the crack development and the brazing. Therefore, the spacing distance d3 from the bottom surface 114 of the opening portion 140 to the end 122 of the support eyelet 120 fastened through the thread 141 may be 1 mm to 5 mm. However, the present invention is not limited thereto, and in some instances, the spacing distance d3 may be smaller or greater than the above-mentioned distance.

Figure 4A:
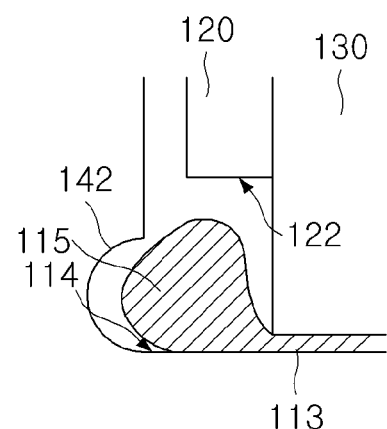
FIGS. 4A and 4B are a view for specifically explaining a degree to which an end of a support eyelet illustrated in FIG. 2B is spaced apart from a ceramic surface opposite thereto.
Figure 4B:
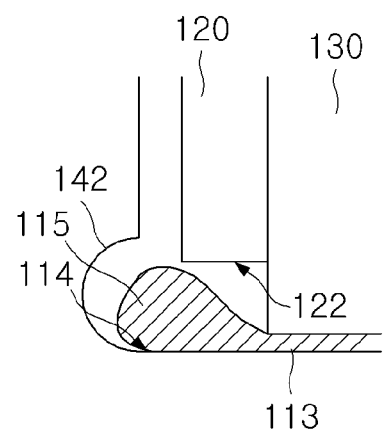

FIGS. 4A and 4B are a view for specifically explaining a degree to which the end 122 of the support eyelet 120 illustrated in FIG. 2B is spaced apart from the ceramic surface opposite thereto.

As illustrated in FIG. 4A, the end 122 of the support eyelet 120 fastened through the thread 141 may sometimes extend to a portion before a start boundary line of the concave portion 142 in accordance with design, and in some instances, the end 122 of the support eyelet 120 fastened through the thread 141 may sometimes extend to a portion beyond the start boundary line of the concave portion 142 in accordance with design.

In both cases, the spacing distance d3 from the bottom surface 114 of the opening portion 140 to the end 122 of the support eyelet 120 fastened through the thread 141 may be 1 mm to 5 mm, and the effect of preventing crack development may deteriorate if the spacing distance d3 is out of the above-mentioned range.

As described above, in the present invention, since the predetermined spacing distance d3 from the bottom surface 114 of the opening portion 140 to the end 122 of the support eyelet 120 is maintained, stress (or force) applied to the ceramic surface 114 around the bottom by the end 122 of the support eyelet 120 is removed even though the support eyelet 120 is thermally expanded and deformed as the heater is used for a long period of time or during the brazing. Further, it is possible to improve durability by preventing crack development at the ceramic surface around the opening portion 140 of the electrode part, which occurred in the related art (see FIG. 1).

As described above, according to the ceramic heater according to the present invention, the end of the support eyelet 120 of the electrode rod 130 is spaced apart from the ceramic surface opposite thereto and the space for placing the filler mass 115 is provided around the end of the support eyelet 120 of the electrode rod 130, whereby force or stress applied to the ceramic surface due to the expansion of the support eyelet 120 or by the filler mass is removed, such that it is possible to improve durability by preventing crack development at the ceramic surface around the electrode part 150.

While the present invention has been described above with reference to particular contents such as specific constituent elements, the limited exemplary embodiments, and the drawings, but the exemplary embodiments are provided merely for the purpose of helping understand the present invention overall, and the present invention is not limited to the exemplary embodiment, and may be variously modified and altered without departing intrinsic features of the present invention. Accordingly, the spirit of the present invention should not be limited to the described exemplary embodiment, and all of the equivalents or equivalent modifications of the claims as well as the appended claims belong to the scope of the spirit of the present invention.

What is claimed is:

1. A ceramic heater comprising:
   a ceramic plate including an embedded heating element,
   a thread formed on at least one part of an inner circumferential surface of an opening portion, and a connector electrically connected to the heating element and embedded to be partially exposed from a bottom surface of the opening portion; and
   a support eyelet fastened through the thread and coupled to an electrode rod,
   wherein the ceramic plate includes a concave portion formed to be recessed inward from an inner circumferential surface of the opening portion along an edge of the bottom surface.

2. The ceramic heater of claim 1, wherein the support eyelet is fastened through the thread so that an end of the support eyelet is spaced apart from the bottom surface of the opening portion by a predetermined distance.

3. A ceramic plate comprising:
   a thread formed on a part of an inner circumferential surface of an opening portion and configured to fasten a support eyelet coupled to an electrode rod;
   a connector electrically connected to an embedded heating element and embedded to be partially exposed from a bottom surface of the opening portion; and
   a concave portion formed to be recessed inward from the inner circumferential surface of the opening portion along an edge of the bottom surface.

4. The ceramic plate of claim 3, wherein the concave portion is configured to accommodate a filler mass produced at the time of brazing an end surface of the electrode rod and the connector after the support eyelet is fastened.

5. The ceramic plate of claim 4, wherein a stress applied to a surrounding ceramic surface by the filler mass is removed.

6. The ceramic plate of claim 3, wherein the support eyelet is fastened through the thread so that an end of the support eyelet is spaced apart from the bottom surface of the opening portion by a predetermined distance.

7. The ceramic plate of claim 3, wherein stress applied to a surrounding ceramic surface by the end of the support eyelet due to thermal expansion or deformation is removed.

8. The ceramic plate of claim 3, wherein a depth from an inlet of the opening portion to an end of a portion having the thread is 10% to 90% of an overall depth of the opening portion.

9. The ceramic plate of claim 3, wherein an end of the support eyelet fastened through the thread is spaced apart from the bottom surface of the opening portion by 1 mm to 5 mm.

10. The ceramic plate of claim 3, wherein the concave portion is roundly formed such that a maximally recessed portion is recessed inward by 0.1 mm to 3 mm from an extension line of the inner circumferential surface before the concave portion is formed.

11. The ceramic heater of claim 1, wherein the concave portion is configured to accommodate a filler mass produced at the time of brazing an end surface of the electrode rod and the connector after the support eyelet is fastened.

12. The ceramic heater of claim 11, wherein a stress applied to a surrounding ceramic surface by the filler mass is removed.

13. The ceramic heater of claim 1, wherein stress applied to a surrounding ceramic surface by the end of the support eyelet due to thermal expansion or deformation is removed.

14. The ceramic heater of claim 1, wherein a depth from an inlet of the opening portion to an end of a portion having the thread is 10% to 90% of an overall depth of the opening portion.

15. The ceramic heater of claim 1, wherein an end of the support eyelet fastened through the thread is spaced apart from the bottom surface of the opening portion by 1 mm to 5 mm.

16. The ceramic heater of claim 1, wherein the concave portion is roundly formed such that a maximally recessed portion is recessed inward by 0.1 mm to 3 mm from an extension line of the inner circumferential surface before the concave portion is formed.

\* \* \* \* \*